United States Patent [19]
Korenaga

[11] Patent Number: 6,128,069
[45] Date of Patent: Oct. 3, 2000

[54] STAGE MECHANISM FOR EXPOSURE APPARATUS

[75] Inventor: Nobushige Korenaga, Utsunomiya, Japan

[73] Assignee: Canon Kabushiki Kaisha, Tokyo, Japan

[21] Appl. No.: 09/041,103

[22] Filed: Mar. 12, 1998

[30] Foreign Application Priority Data

Mar. 13, 1997 [JP] Japan .................................. 9-076671
Mar. 19, 1997 [JP] Japan .................................. 9-084705

[51] Int. Cl.[7] .......................... G03B 27/42; G03B 27/58; G03B 27/62
[52] U.S. Cl. .................................. 355/53; 355/72; 355/75
[58] Field of Search .................................. 355/53, 67, 77, 355/72, 75, 71; 356/399, 400, 401; 250/548; 318/625, 687, 632, 628

[56] References Cited

U.S. PATENT DOCUMENTS

| 5,040,431 | 8/1991 | Sakino et al. .............................. 74/479 |
| 5,194,893 | 3/1993 | Nishi .......................................... 355/53 |
| 5,281,996 | 1/1994 | Bruning et al. ........................... 355/77 |
| 5,467,720 | 11/1995 | Korenaga et al. ........................ 108/20 |
| 5,518,550 | 5/1996 | Korenaga et al. ....................... 118/729 |
| 5,610,686 | 3/1997 | Osanai ....................................... 355/72 |
| 5,684,856 | 11/1997 | Itoh et al. .................................. 378/34 |
| 5,760,564 | 6/1998 | Novak ....................................... 318/687 |
| 5,781,277 | 7/1998 | Iwanmoto .................................. 355/53 |
| 5,822,043 | 10/1998 | Ebinuma ................................... 355/55 |
| 5,839,324 | 11/1998 | Hara ........................................ 74/490.09 |
| 5,841,250 | 11/1998 | Korenage et al. ...................... 318/135 |
| 5,858,587 | 1/1999 | Yamane et al. ........................... 430/22 |

FOREIGN PATENT DOCUMENTS 0 684 523  11/1995  European Pat. Off. .
2665740    of 0000  Japan .

*Primary Examiner*—Russell Adams
*Assistant Examiner*—Henry Hung Nguyen
*Attorney, Agent, or Firm*—Fitzpatrick, Cella, Harper & Scinto

[57] ABSTRACT

A stage mechanism includes a first stage being movable in a first direction and along a base table, a second stage being movable in a second direction, intersecting the first direction, and along the base table, while being guided by a guide provided on the first stage, first and second fluid static pressure applying devices for supporting, with fluid, the first and second stages, respectively, upon the base table, and first and second preloading magnet units provided on the first and second stages, respectively, for attracting the first and second stages toward the base table, respectively. At least one of the first and second preloading magnet units includes a plurality of rectangular magnet pieces.

23 Claims, 16 Drawing Sheets

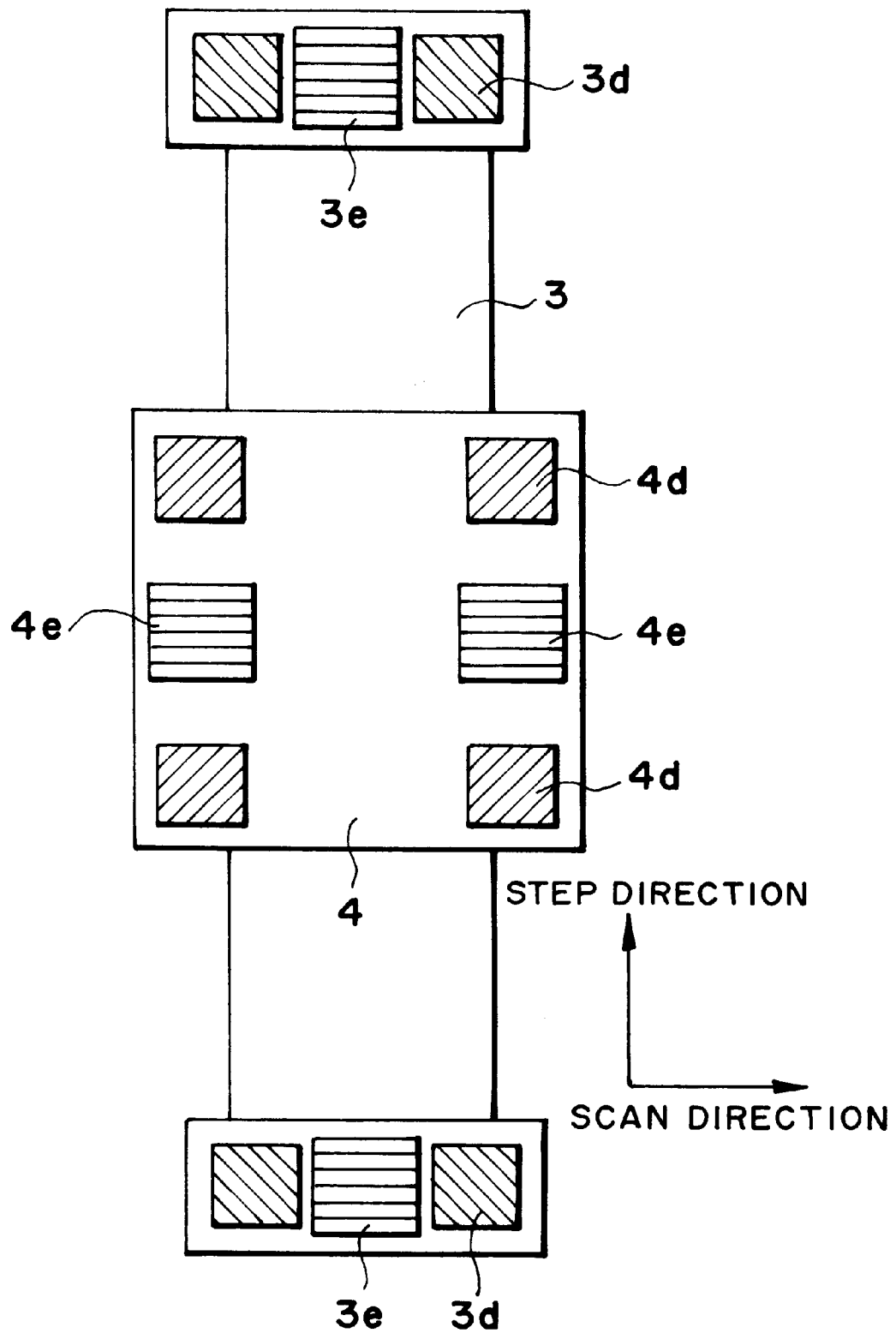
F I G. 1

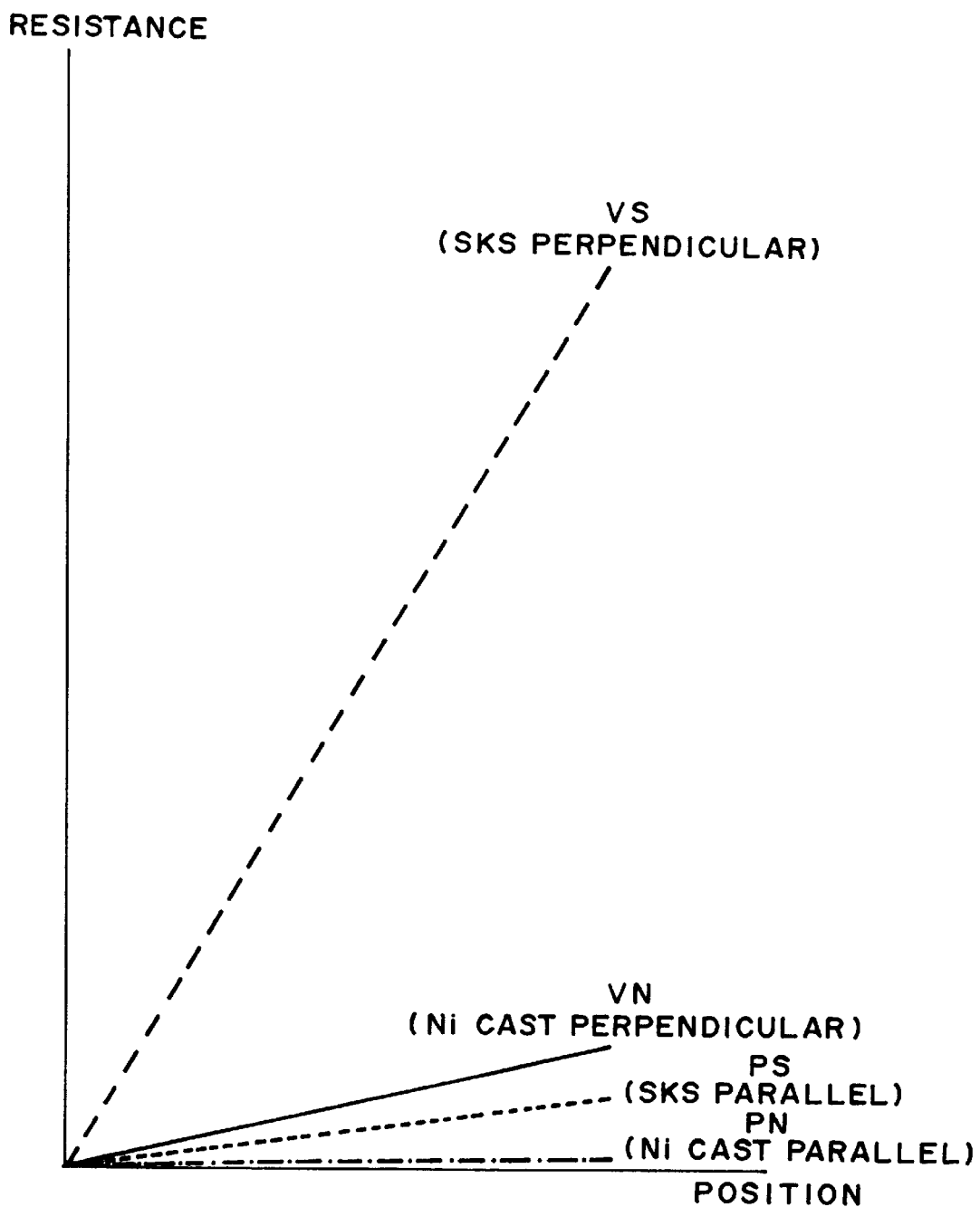
F I G. 4

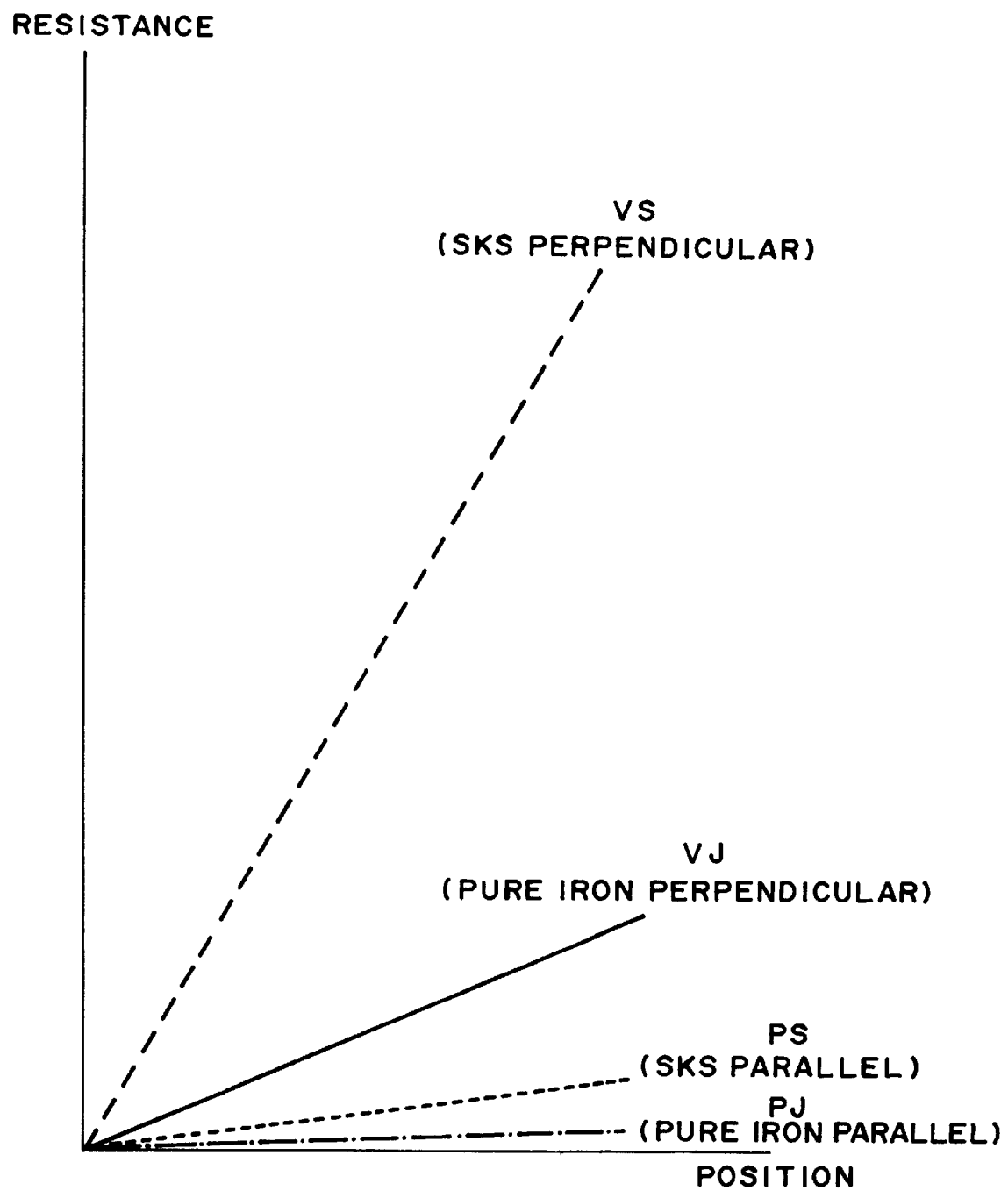
F I G. 9

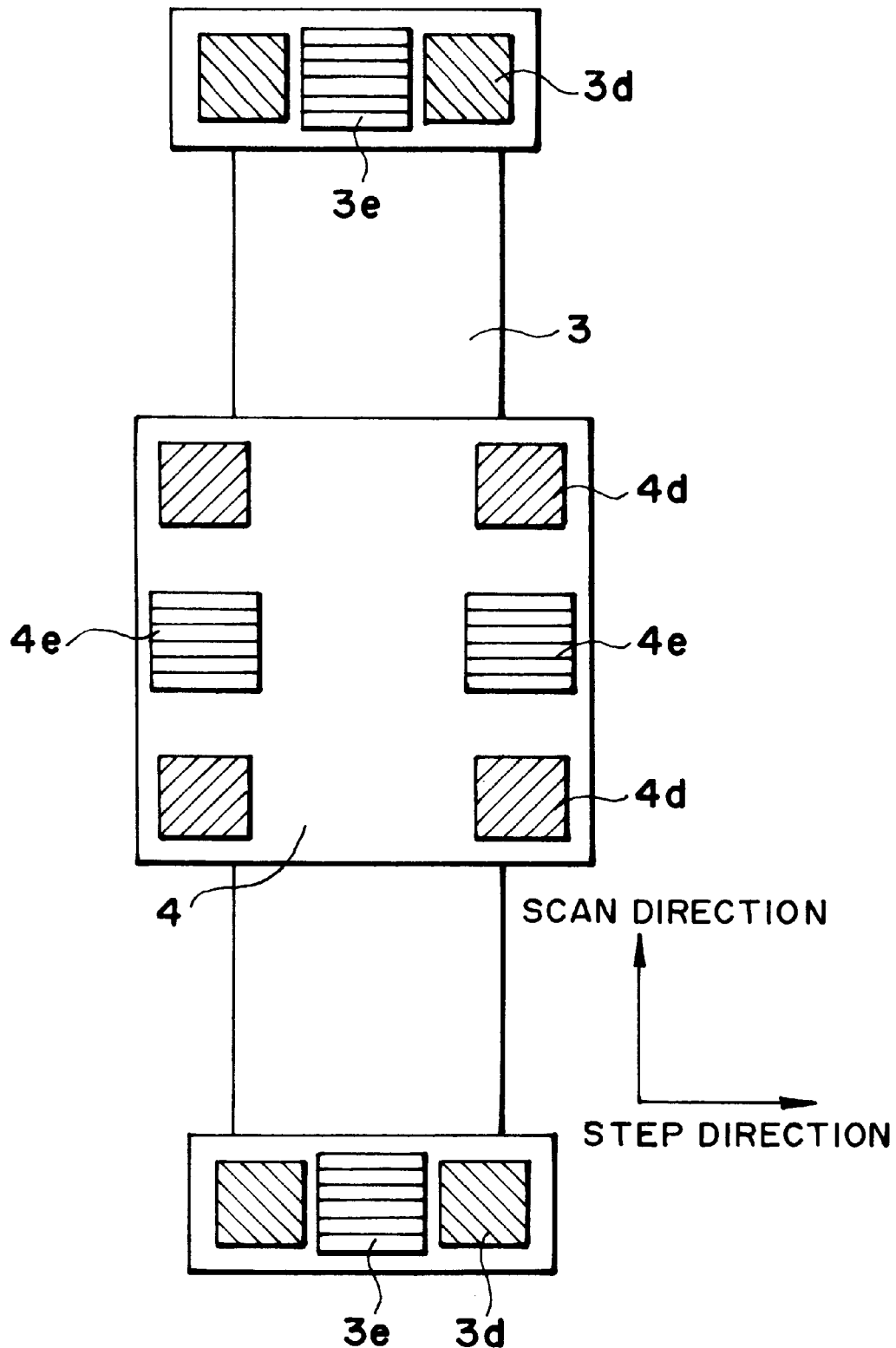
F I G. 10

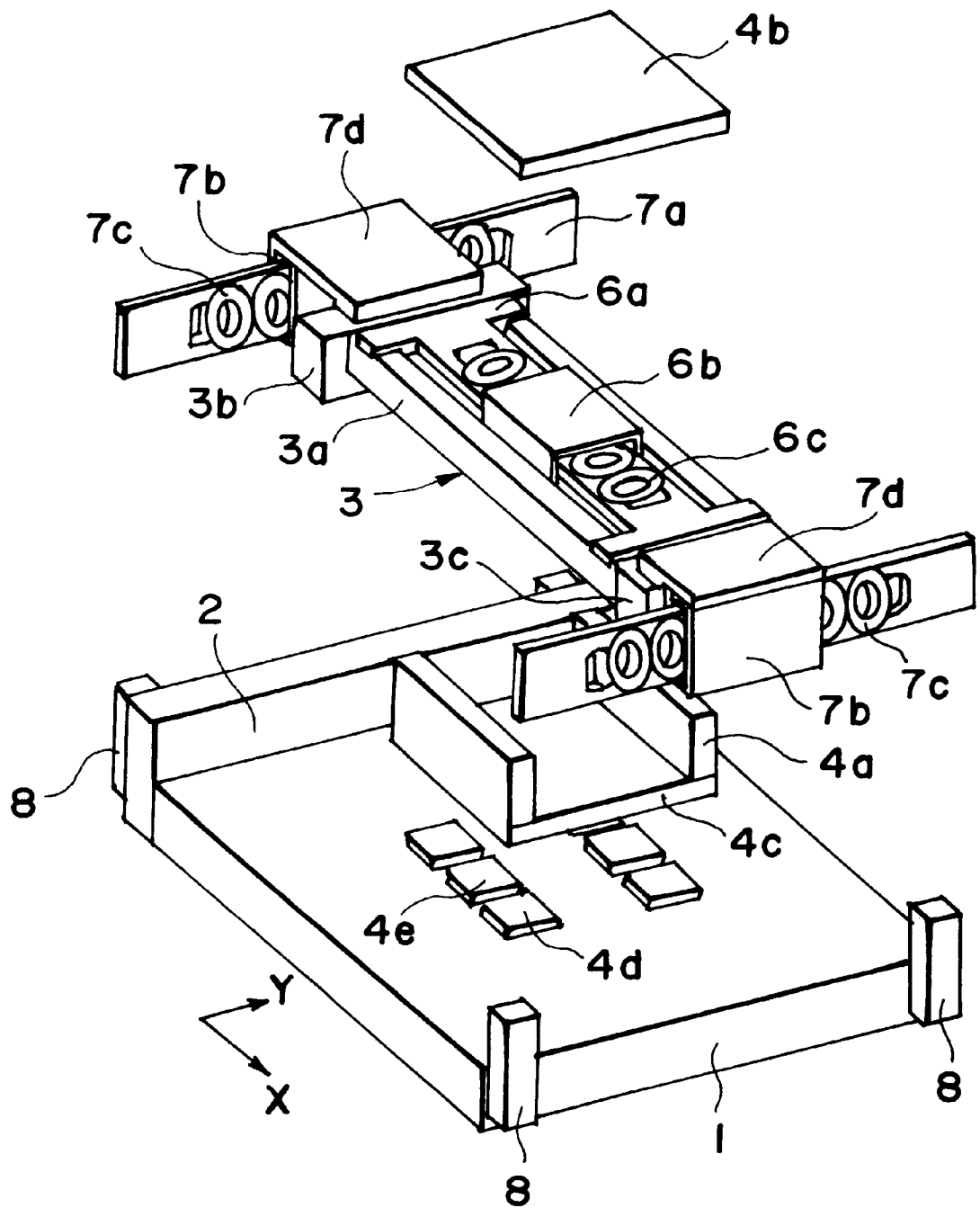
F I G. 14

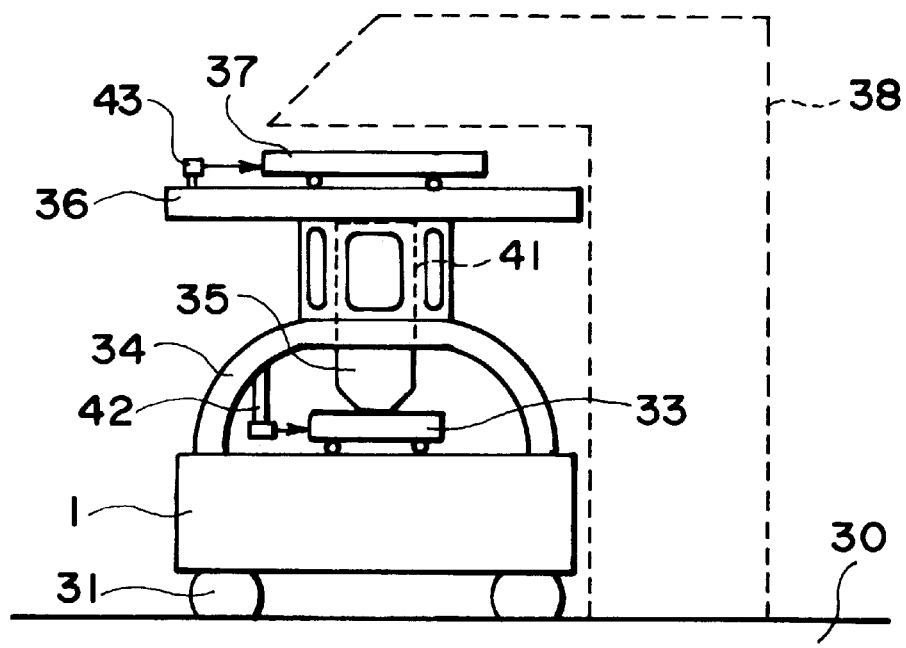
F I G. 16
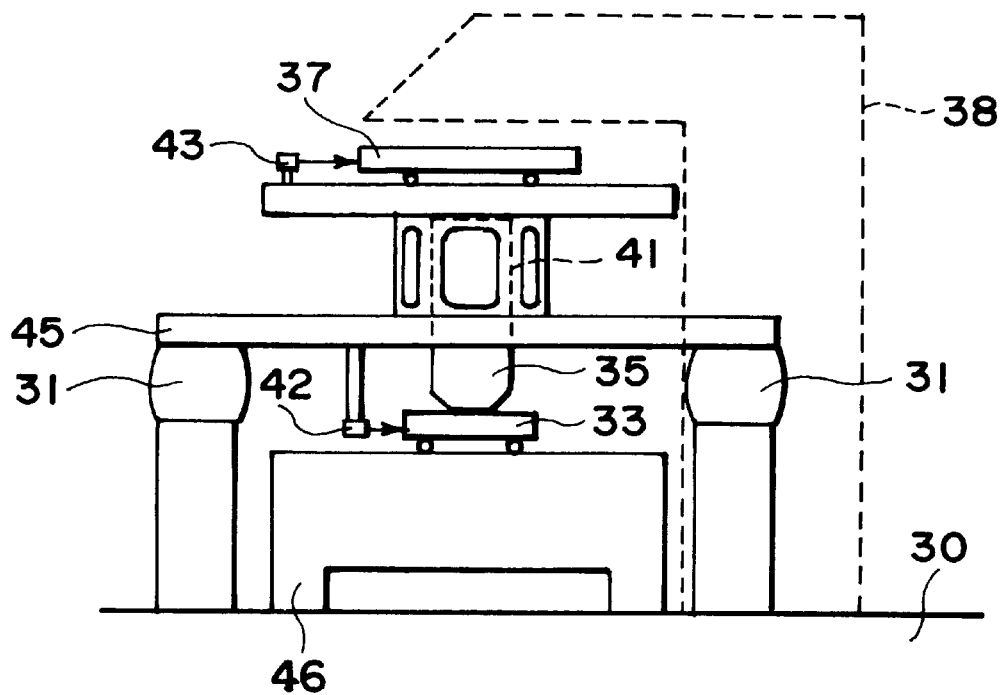
F I G. 17

STAGE MECHANISM FOR EXPOSURE APPARATUS

FIELD OF THE INVENTION AND RELATED ART

This invention relates to a stage mechanism and, more particularly, to a static pressure stage device wherein a movable stage is supported while being floated by a static pressure relative to a base table and wherein a magnet is provided for attracting the movable stage toward the base table to provide an improved supporting rigidity. The stage device of the present invention is suitably usable in a scan type exposure apparatus, for example.

The line width of a circuit pattern has been reduced more and more, for improvement of density and operation speed of a semiconductor device such as an LSI, for example. For circuit pattern formation in the LSI manufacturing processes, fine pattern formation based on a lithographic process using a radiation beam such as X-rays, vacuum ultraviolet rays or electron beams has been attractive. An example according to this effective method is a scanning type exposure apparatus wherein a reticle stage having a reticle mounted thereon and a wafer stage having a wafer mounted thereon are scanningly moved in a timed relation and at a speed ratio corresponding to the reduction magnification of a projection optical system, as disclosed in European Patent Publication No. 684 523, U.S. Pat. No. 5,281,996, or U.S. Pat. No. 5,194,893.

Generally, the wafer stage in such an exposure apparatus is arranged to be slidably moved in two-dimensional directions, i.e., along the exposure optical axis and along a plane perpendicular thereto. The wafer stage is supported on a base table by air slide means. For enhanced stage positioning precision, the gap of the air slide should be kept at about 5 microns. To this end, the wafer stage is equipped with air pads for defining the air slide and a preloading magnet for attracting the stage toward the base table.

As regards the base table, it is a member to be attracted by the magnet and also it is a member that defines a guiding surface for the air slide. For these reasons, usually the base table is provided by a magnetic material such as SKS, having been quenched and polished.

The preloading magnet for keeping the air gap should desirably provide an attraction force in a direction opposite to the floating direction of the air slide. Actually, however, it additionally produces a resisting force in the sliding direction of the air slide.

In a scan type exposure apparatus, in regard to the scan direction, non-uniformness and the absolute value of such a running resistance during the scan raise a problem. In the scan type exposure apparatus, exposure is performed during the scan operation and, for this reason, any non-uniformness of running resistance during the scan causes thrust disturbance, separate from floor vibration, which adversely affects the stage to degrade the superposition precision of scan exposure with respect to the scan direction.

Such non-uniformness of running resistance may be generally categorized into (i) non-uniformness resulting from the resistance itself due to the magnetic hysteresis at a large relative displacement between the magnet and the base table, and (ii) non-uniformness produced as a result of a combination with the driving system even though there is no non-uniformness of magnetic hysteresis resistance.

Further, if the absolute value of running resistance is large, an additional thrust for overcoming the resistance is required, and this causes enlargement of heat production in the driving system or enlargement of a cooling system for removing the heat.

On the other hand, in the scan type exposure apparatus, there are unique notions of scan direction and non-scan direction (stepping direction). This provides a possibility of using anisotropy of a spring property of a magnet.

SUMMARY OF THE INVENTION

It is an object of the present invention to provide a static pressure stage mechanism with less thrust resistance of a preloading magnet.

It is another object of the present invention to provide a static pressure stage mechanism with less thrust disturbance by a preloading magnet.

In accordance with an aspect of the present invention, there is provided a stage mechanism, comprising: a first stage movable in a first direction along a base table while being guided by a first guide provided on the base table; a second stage movable in a second direction, intersecting the first direction, along the base table while being guided by a second guide provided on said first stage; first and second fluid static pressure applying means for floating, with fluid, said first and second stages, respectively; and first and second preloading magnets provided on said first and second stages, respectively, and for attracting said first and second stages toward the base table, respectively, wherein said first and second preloading magnets may comprise a plurality of rectangular magnet pieces arrayed one-dimensionally with their sides juxtaposed. The first preloading magnet may preferably be disposed so that the direction of array of the magnet pieces is perpendicular to the first direction.

A static pressure stage mechanism according to this aspect of the present invention may be suitably incorporated into a wafer stage of a scan type exposure apparatus. On that occasion, the first direction may be perpendicular to the second direction, and one of the first and second directions may correspond to a scan direction and the other may correspond to a stepping direction.

For reduced thrust resistance of the preloading magnet, the first direction may correspond to the scan direction, and the direction of elongation of each magnet piece of the second preloading magnet may be placed in the scan direction. Alternatively, the second direction may correspond to the scan direction, and the direction of elongation of each magnet piece of the second preloading magnet may be placed in the scan direction.

For reduced thrust disturbance of the preloading magnet, the second direction may correspond to the stepping direction, and the direction of elongation of each magnet piece of the second preloading magnet may be placed in the stepping direction. Alternatively, the first direction may correspond to the stepping direction and the direction of elongation of each magnet piece of the second preloading magnet may be placed in the stepping direction.

The base table may preferably comprise one of a Ni series cast, low-carbon iron series material, and pure iron.

In a static pressure stage mechanism when applied to a scan type exposure apparatus, the direction (widthwise direction) of array of the rectangular magnet pieces, constituting a preloading magnet, may be placed perpendicularly to the scan axis, that is, the direction of elongation of the rectangular magnet pieces may be disposed parallel to the scan direction, and this may effectively reduce the thrust resistance of the preloading magnet.

Also, in a static pressure stage mechanism when applied to a scan type exposure apparatus, the direction (widthwise direction) of array of the rectangular magnet pieces, constituting a preloading magnet, may be placed perpendicularly to the stepping direction, that is, the direction of elongation of the rectangular magnet pieces may be disposed parallel to the stepping direction, and this may effectively reduce the thrust disturbance by the preloading magnet.

The thrust resistance or thrust disturbance may be reduced more, by suitably selecting the material of the base table.

In accordance with another aspect of the present invention, there is provided a stage mechanism, comprising: a first stage movable in a first direction along a base table while being guided by a first guide provided on the base table; a second stage movable in a second direction, intersecting the first direction, along the base table while being guided by a second guide provided on said first stage, said second stage also being movable in the first direction with the movement of said first stage; first and second fluid static pressure applying means for floating, with fluid, said first and second stages, respectively; and first and second preloading magnets for attracting said first and second stages toward the base table, respectively, wherein one of the first and second directions is defined as a scan direction and wherein said second preloading magnet comprises a magnet unit having a plurality of elongated magnet pieces being disposed in an array of a rectangular shape with its longer side placed in the scan direction and with its shorter side placed in a direction perpendicular to the scan direction.

Each magnet piece of said magnet unit may preferably have a length substantially the same as the length of the longer side of the magnet unit.

The magnet unit described above is of a type not divided with respect to the lengthwise direction but divided in the widthwise direction only. The first preloading magnet may comprise a second magnet unit of the same shape as the first-mentioned magnet unit. The second magnet unit should be disposed with its longer side placed in the first direction, regardless of whether the scan direction is placed in any one of the first and second directions.

A static pressure stage mechanism according to this aspect of the present invention may preferably be incorporated into a wafer stage of a scan type exposure apparatus.

In a static pressure stage mechanism when applied to a scan type exposure apparatus, a preloading magnet unit may have a plurality of rectangular magnet pieces disposed one-dimensionally with an oblong shape, wherein the length of a side perpendicular to the scan direction may be shorter than the length of a side parallel to the scan direction, and wherein the scan direction may be perpendicular to the direction (widthwise direction) along which the rectangular magnet pieces are arrayed, that is, the lengthwise direction of the rectangular magnet pieces is parallel to the scan direction. This may effectively reduce the running resistance in the scan direction, due to the thrust force of the preloading magnet. As a result of reduced running resistance, heat generation is reduced, and it effectively contributes to an increase of exposure precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and bottom view of a wafer stage mechanism according to a first embodiment of the present invention.

FIG. 4 is a graph for comparison of a spring constant, with respect to the direction of the preloading magnet as well as the material of the base table, usable in the stage mechanism of FIG. 1.

FIG. 9 is a graph for comparison of a spring constant, with respect to the direction of the preloading magnet as well as the material of the base table, usable in the stage mechanism of FIG. 6.

FIG. 10 is a schematic and bottom view of a wafer stage mechanism according to a fourth embodiment of the present invention.

FIG. 14 is an exploded view of the wafer stage mechanism of FIG. 13.

FIG. 16 is a schematic and side view of a general structure of a scan type exposure apparatus into which a stage mechanism according to the present invention can be incorporated.

FIG. 17 is a schematic and side view of a general structure of another example of a scan type exposure apparatus into which a stage mechanism according to the present invention can be incorporated.

DESCRIPTION OF THE PREFERRED EMBODIMENTS

[First Embodiment]

Figure 2:
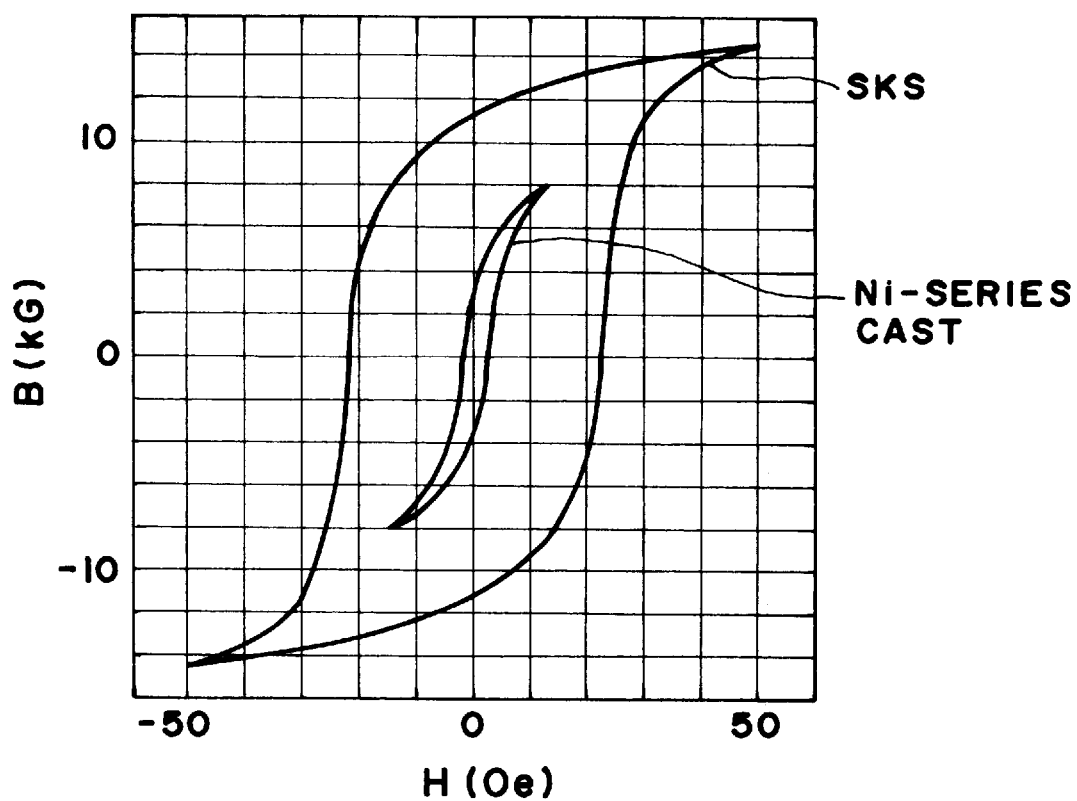
FIG. 2 is a graph for comparison of a B-H curve, with respect to materials usable in a base table of the stage mechanism of FIG. 1.

The general structure of a scan type exposure apparatus is illustrated in FIG. 16. In FIG. 16, a base table 1 is supported on a floor (or ground) 30 with anti-vibration means 31 interposed therebetween. Mounted on the base table 1 is a wafer stage 33 which is movable along an X-Y plane, and also there is a reduction projection optical system 35 mounted through a barrel supporting member 34. Disposed above the supporting member 34 is a reticle stage base 36 on which a reticle stage 37 is provided scanningly movably in one axial direction along a guide. Illumination system 38, for applying exposure energy to a wafer through a reticle, is depicted by a broken line. Denoted at 41 is an outside barrel of the projection optical system 35, and denoted at 42 and 43 are reference members of interferometers.

In this apparatus, only a portion of a rectangular region of a reticle pattern is illuminated. For exposure of the whole region, the wafer stage 33 and the reticle stage 37 are scanningly moved in synchronized relation, at a speed ratio corresponding to the reduction magnification of the projection optical system 35, whereby the exposure is performed during the scan. The wafer stage 33 is an X-Y stage (movable in X and Y directions), but it is controlled so that, during the exposure process, scanning is made along the axis parallel to the axis of the reticle stage 37, and it is held stationary with respect to the other axis.

FIG. 17 shows a system corresponding to a modified example of the FIG. 16 structure.

Projection optical system 35 supported by a barrel base table 45 is mechanically separated from a wafer stage base 46, and it is supported directly on the floor 30 through anti-vibration means 31. This structure provides an advantage that any vibration from the wafer stage 33 is not transmitted to the projection optical system 35 or the interferometer reference members, and thus, mechanical deformation or vibration of the projection optical system 35 or of the interferometer reference members 42 and 43 can be made very small.

Wafer stage base table 46 is directly supported by the floor 30 without intervention of anti-vibration means 31. This structure provides an advantage that swinging-back of the base table 46 due to a reactive force produced by acceleration or deceleration of the wafer stage 33 is very small, and thus, stop precision is improved and stabilization time is reduced.

Details of the wafer stage usable in such a scan type exposure apparatus will be described below.

Figure 13:
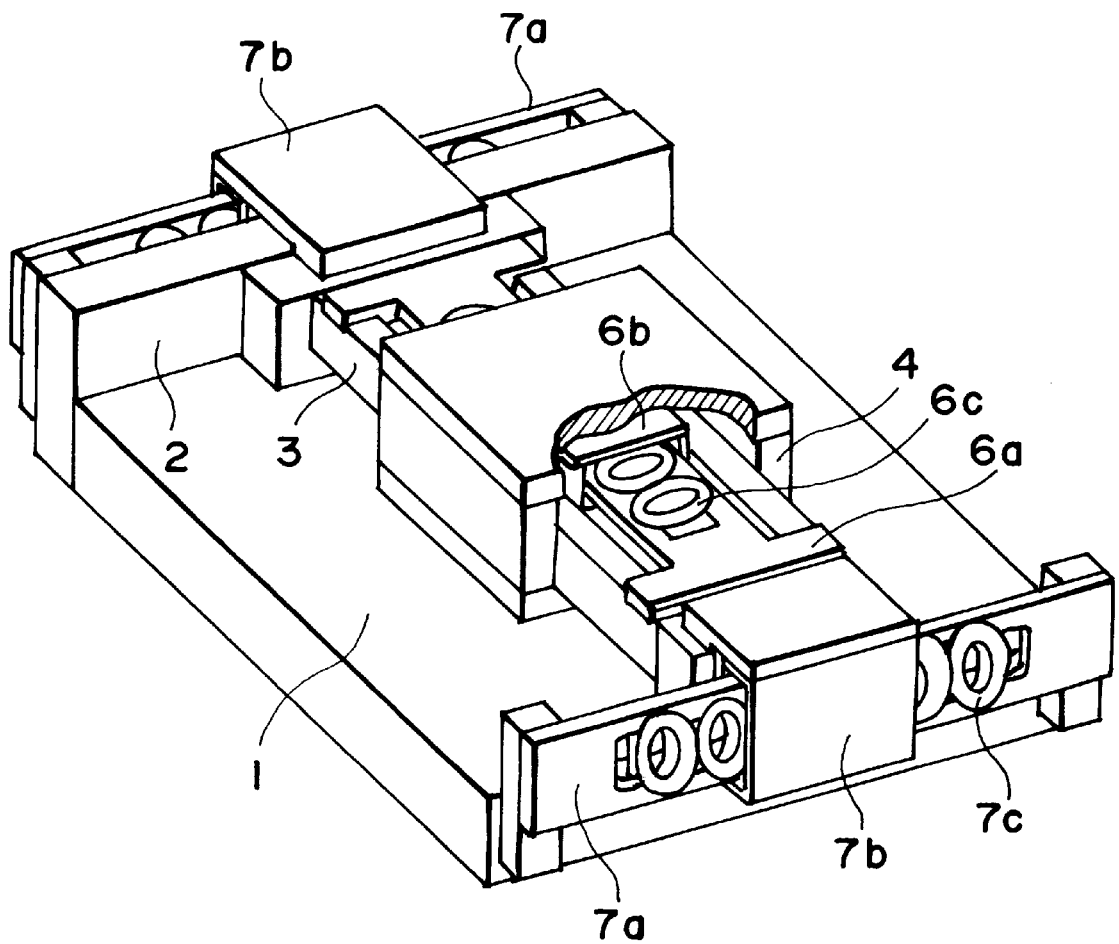
FIG. 13 is a perspective view of a general structure of a wafer stage mechanism to which the present invention is applicable.

FIG. 13 shows a detailed structure of a wafer stage in a scan type exposure apparatus. FIG. 14 is an exploded view of this wafer stage. As shown in these drawings, a Y yaw guide 2 is fixedly mounted on a base table 1. A side face of the Y yaw guide 2 and the top face of the base table 1 provide a guide for a Y stage 3. The Y stage 3 is supported on the base table 1 and it is held slidably by an air slide (not shown) with respect to the Y direction. The Y stage mainly comprises four members, that is, two X yaw guides 3a, a large Y slider 3b and a small Y slider 3c. The large Y slider 3b is disposed opposed to the side face of the Y yaw guide 2 and the top face of the base table 1, through air pads (not shown). The small Y slider 3c is disposed opposed to the top face of the base table 1 through air pads (not shown) provided at the side face of the small Y slider. Thus, the Y stage 3 as a whole is supported by the side face of the Y yaw guide 2 and the top face of the base table 1, slidably with respect to the Y direction.

On the other hand, there is an X stage 4 which is guided by the side faces of the two X yaw guides 3a (which are components of the Y stage 3) and by the top face of the base table 1. The X stage 4 is provided around the X axis so as to surround the Y stage 3. The X stage 4 is supported slidably by an air slide (not shown) with respect to the X direction. The X stage mainly comprises four members, that is, two X stage side plates 4a, an X stage top plate 4b and an X stage bottom plate 4c. The X stage bottom plate 4c is disposed opposed to the top face of the base table 1 through air pads 4d (hydrostatic pressure applying means) which are provided on the bottom face of the X stage bottom plate. The two X stage side plates 4a are disposed opposed to the side faces of the two X yaw guides 3a (which are components of the Y stage 3), through air pads (not shown) provided on the side faces of the X stage side plates 4a. The bottom face of the X stage top plate 4b and the top face of the X yaw guides 3a as well as the top face of the X stage bottom plate 4c and the bottom face of the X yaw guides 3a are maintained out of contact with each other. As a result, the X stage 4 as a whole is supported by the side faces of the two X yaw guides 3a and by the top face of the base table 1, slidably with respect to the X direction. There is a workpiece holding mechanism (not shown) for holding a workpiece such as a wafer, and it is disposed above the X stage top plate 4b. Also, a square mirror (not shown) is mounted here, for precise measurement of the positions of the X and Y stages 4 and 3 by use of laser interferometers.

A driving mechanism comprises linear motors of the multi-phase coil switching type, one for X drive and two for Y drive. Stators 6a and 7a include coils 6c and 7c juxtaposed in the stroke direction and being inserted into frames, respectively. Movable elements 6b and 7b are provided by box-like magnet units, respectively. Denoted at 7d are magnet connecting plates, and denoted at 8 are Y stator fixing members. Depending on the positions of the movable elements 6b and 7b, electric currents are selectively applied to the coils 6c and 7c of the stators 6a and 7a, whereby a thrust force is produced.

For larger rigidity of the air slide, a gap of about 5 microns should be maintained. To this end, the X stage 4 is attracted toward the base table 1 by means of two preloading magnets 4e which are disposed between the air pads 4d.

Similarly, the Y stage 3 is attracted at the side face of the large Y slider 3b toward the Y yaw guide 2 by means of a preloading magnet (not shown), and, to this end, it is attracted at the bottom face of the large Y slider 3b and the bottom face of the small Y slider 3c toward the base table 1 by means of a preloading magnet (not shown).

Figure 15:
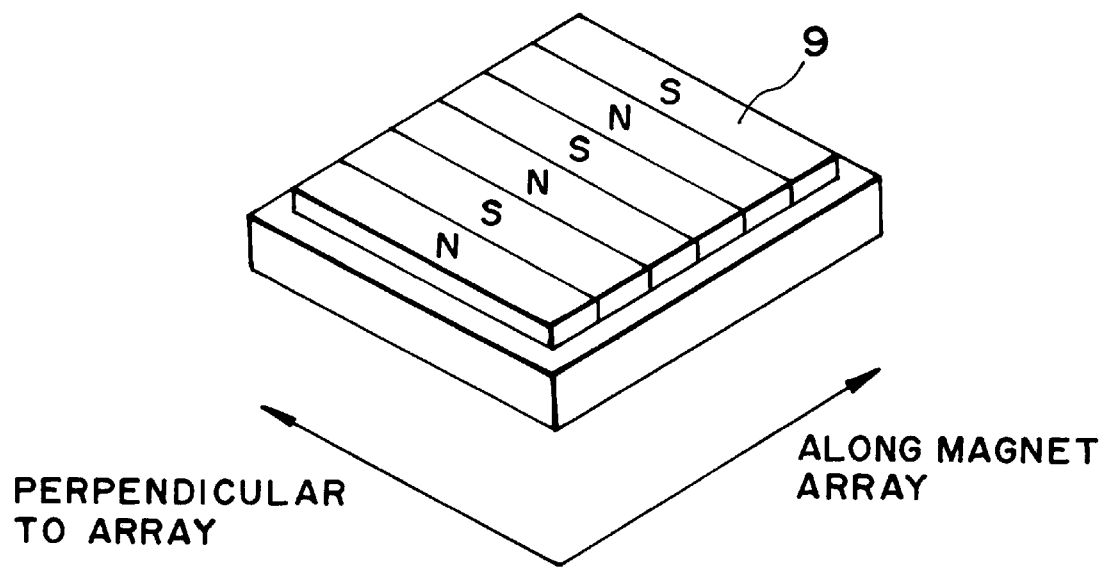
FIG. 15 is a schematic view of a magnet unit which functions as a preloading magnet.

These preloading magnets may comprise a combination of arrayed magnet pieces of rectangular shape, such as shown in FIG. 15.

Base table 1 is conventionally made of a material of SKS. In this embodiment and a second embodiment to be described later, the base table 1 is made of a Ni series cast material.

A preloading magnet produces resistance as follows. As a preloading magnet displaces from a position to another, magnetization of the base table material at the position where the preloading magnet has been is not completely extinguished but partly remains there. This functions to resist the motion of the magnet. Namely, the resistance is attributable to magnetic hysteresis. The resistance resulting from magnetic hysteresis is proportional to the area as surrounded by the B-H curves of the material. In consideration of this, the base table or yaw guide may preferably be made of a material having an area surrounded by its B-H curves that is smaller.

On the other hand, the base table 1 or the yaw guide 2 should be a member to be attracted by a magnet. Thus, they may preferably be made of a material having sufficient transmissivity to magnetic flux, that is, a large saturated magnetic flux density.

An example that satisfies these requirements is Ni series cast. A typical composition is as follows:

| Ni | Co | Si | C | Mn | Cr |
|---|---|---|---|---|---|
| 30 | 8.6 | 0.6 | 0.4 | 0.3 | 0.2 (mass %) |

FIG. 2 shows a comparison of B-H curves of SKS and Ni series cast. The B-H curve area of Ni series cast is notably smaller than that of SKS. On the other hand, it will provide a saturated magnetic flux density of about 0.8 T, and a high attracting force can be expected.

FIG. 1 shows a first embodiment of the present invention, and it illustrates an X stage 4 and a Y stage 3 as viewed from the bottom, wherein the Y direction is set as a scan direction while the X direction is set as a stepping direction. Both of the X stage 4 and the Y stage 3 are arranged so that the direction of magnetic array, of rectangular magnet pieces (widthwise direction of each magnet piece) which constitute a preloading magnet 4e or 3e, is perpendicular to the scan axis (Y axis). Namely, the lengthwise direction of the magnet piece is parallel to the scan axis.

The reason for the above is that, if scan is made perpendicularly to the longer side of the rectangular magnet piece (i.e., to the lengthwise direction thereof), there occurs non-uniformness of resistance in synchronism with the magnetic pole pitch. This will be described below, in greater detail.

Figure 3:
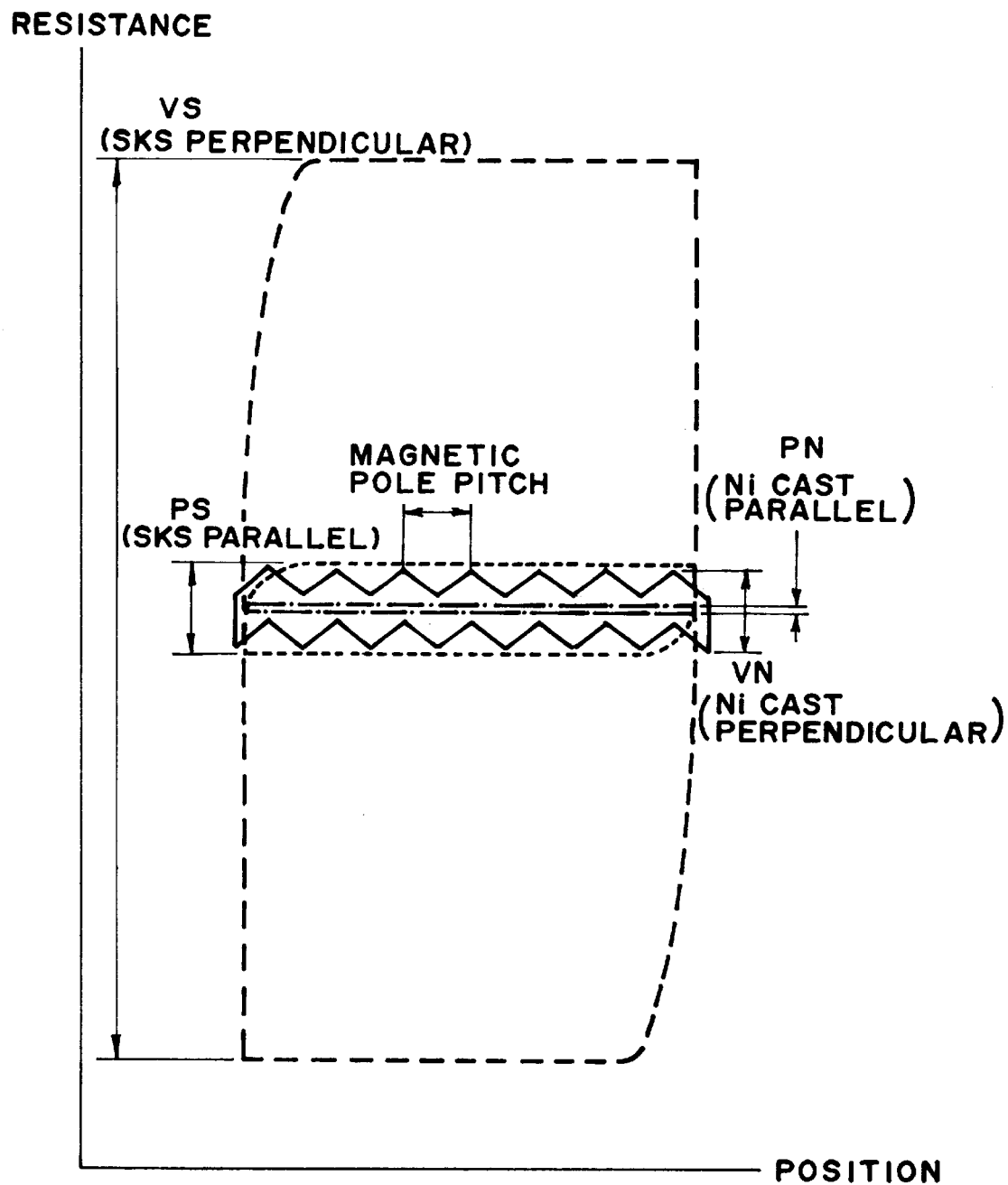
FIG. 3 is a graph for comparison of a scan resistance, with respect to the direction of the preloading magnet as well as the material of the base table, usable in the stage mechanism of FIG. 1.

FIG. 3 shows the relation between the position and resistance, for SKS and Ni series cast, in a case where two preloading magnets (corresponding to those of the X stage 4) are scanned perpendicularly to the longer side of the rectangular magnet and in a case where they are scanned parallel to it. Denoted at VS, PS, VN and PN are quantities corresponding to twice the scan resistance. Actually measured values of them are:

VS=1150 g (SKS perpendicular)
PS=100 g (SKS parallel)
VN=60 g (Ni series perpendicular)
PN=10 g (Ni series parallel).

When Ni series material is used, the scan resistance is reduced as expected.

Also, in the case of Ni series perpendicular, there occurs peak-to-peak non-uniformness of about 30 g in synchronism with the magnetic pole pitch (e.g., 7.5 mm).

FIG. 4 shows the relation between the position and resistance, for SKS and Ni series cast, in a case wherein two preloading magnets (corresponding to those of the X stage 4) are moved minutely (about 1 micron) perpendicularly to the longer side of the rectangular magnet and in a case wherein they are moved parallel to it.

Inclination of each straight line corresponds to the spring constant in the thrust direction. Actually measured values of them are:

| | |
|---|---|
| SKS perpendicular = | 1612 g/mm |
| SKS parallel = | 126 g/mm |
| Ni series perpendicular = | 223 gXmm |
| Ni series parallel = | 20 g/mm. |

These values may be an index of easiness of transmission of a lateral component of floor vibration. Also, in this respect, use of a Ni series material will provide reduction as expected.

As regards Ni series parallel direction, there is no non-uniformness of scan, and the value is small. Also, the spring constant of minute displacement is small. Therefore, preferably, it should be used not only in the scan but also in the minute movement. Since the Y stage 3 performs one-dimensional relative motion relative to the base table 1 in the Y direction only, such an arrangement as above is possible.

On the other hand, a current X stage 4 performs two-dimensional relative motion relative to the base table 1, and it receives thrust resistance from the magnet 4e both in the X and Y directions. For this reason, the parallel direction of the magnet longer side can be set only in one of the X and Y directions. How to set this most preferable direction is a problem.

In consideration of the above, in this embodiment, in a stage mechanism wherein the Y direction is set as the scan direction, the minor or widthwise direction of a rectangular magnet piece is placed perpendicularly to the scan axis (that is, the lengthwise direction of the magnetic piece is parallel to the scan direction). This is effective to avoid non-uniformness of running resistance and thus to avoid thrust disturbance due to the non-uniformness.

As regards the spring constant in the scan direction which may function as an index for floor vibration transmission, it is not 20 g/mm in FIG. 3 but is approximately equal to zero. This is because: even if it takes a positive or negative value with reference to a target value due to a servo error during the scan, the absolute value of the position still increases continuously and it is constantly within the range of large displacement. Thus, a substantially constant force is applied.

On the other hand, with regard to the direction perpendicular to the scan direction, only transmission of vibration from the floor should be considered. The spring constant is 223 g/mm as shown in FIG. 3, and it is about ⅛ of that in the case of SKS.

In a case where the Y direction corresponds to the scan direction, for minimization of non-uniformness of thrust resistance during the scan, the lengthwise direction of the rectangular magnet piece should be placed parallel to the scan axis, as in the present invention, both in the X stage 4 and in the Y stage 3. This is because: in the scan operation in Y direction scan, the Y linear motor is used to scan the x stage 4 and the Y stage 3 as a unit. Thus, if in either the X stage or the Y stage the minor (widthwise) direction of the rectangular magnet piece is parallel to the scan axis, non-uniformness is produced in the scan resistance. Also, if the structure is made as above, as regards the vibration transmission in a direction perpendicular to the scan, only those from the X stage 4 are transmitted, since those from the Y stage 3 are intercepted by means of the air slide between the X stage 4 and the Y stage 3.

[Second Embodiment]

Figure 5:
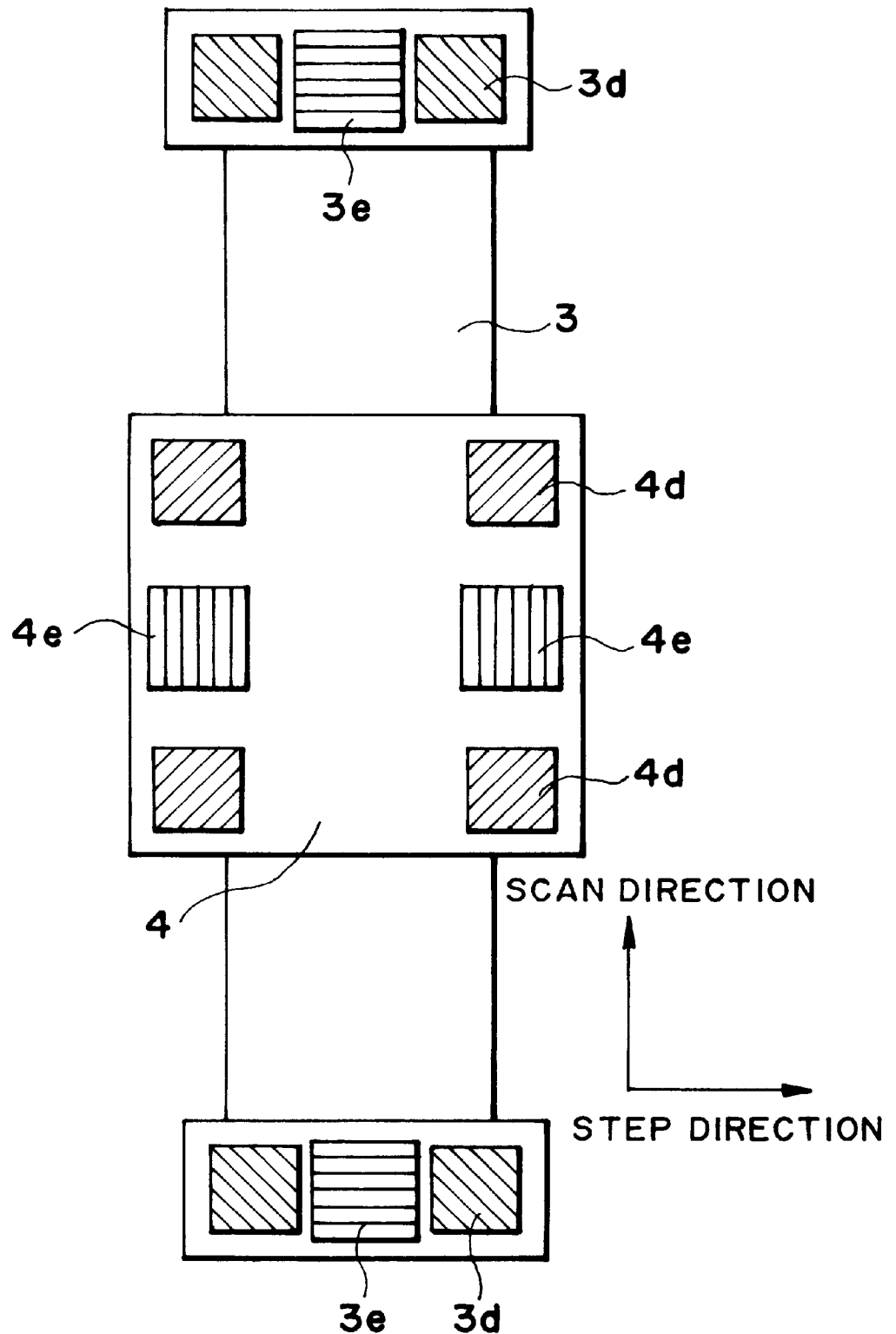
FIG. 5 is a schematic and bottom view of a wafer stage mechanism according to a second embodiment of the present invention.

FIG. 5 shows a second embodiment of the present invention, and it shows an X stage 4 and a Y stage 3 as viewed from the bottom, wherein the X direction is set as the scan direction and the Y direction is set as the stepping direction. In the X stage 4, the direction of magnet array (widthwise direction) of rectangular magnet pieces, constituting a preloading magnet 4c, is disposed perpendicularly to the scan axis. In the Y stage 3, the direction of magnet array (widthwise direction) of rectangular magnet pieces, constituting a preloading magnet 3e, is disposed parallel to the scan direction.

This arrangement is basically to avoid non-uniformness of resistance in the scan direction. From this viewpoint only, it may appear that the longer side of the rectangular magnet piece of the Y stage 3 can be placed in any of the X and Y directions: because in the X scan the X linear motor scans the X stage 4 only such that there is no non-uniformness of resistance produced from the Y stage 3 regardless of the orientation of the rectangular magnet piece of the Y stage 3.

On the other hand, if transmission of vibration from the floor is taken into account, the widthwise direction of an oblong magnet piece of the Y stage 3 should desirably be placed parallel to the scan direction, as in the present embodiment. If the structure is made as above, floor vibration in the direction perpendicular to the scan direction is not easily transmitted to the Y stage 3, while floor vibration in the scan direction is transmitted to the stage. The vibration in the direction perpendicular to the scan direction, if it is transmitted to the Y stage 3, is transmitted to the X stage 4 through the yaw guide. On the other hand, vibration in the scan direction as transmitted to the Y stage 3 is intercepted by the yaw guide, and it is not transmitted to the X stage 4. Thus, in total, the structure provides a system wherein transmission of floor vibration to the X stage 4 through the Y stage 3 is most effectively intercepted.

[Third Embodiment]

In this embodiment, the stage mechanism comprises components the same as those shown in FIGS. 13 or 14. However, while the base table 1 is made of a material of SKS in a conventional structure, it is made of a low carbon iron series material in the third embodiment and in a fourth embodiment to be described later.

A preloading magnet produces resistance as follows. As a preloading magnet displaces from a position to another, magnetization of the SKS material at the position where the preloading magnet has been is not completely extinguished but partly remains there. This functions to resist the motion of the magnet. Namely, the resistance is attributable to magnetic hysteresis. The resistance resulting from magnetic hysteresis is proportional to the area as surrounded by the B-H curves of the material. In consideration of it, the base table 1 or yaw guide 2 may preferably be made of a material having an area surrounded by its B-H curves that is smaller.

On the other hand, the base table or the yaw guide should be a member to be attracted by a magnet. Thus, they may preferably be made of a material having a sufficient transmissivity to magnetic flux, that is, a large saturated magnetic flux density.

An example that satisfies these requirements is a low carbon iron series material, and particularly, pure iron or S10C may be used. In the case of pure iron, an impurity other than carbon may preferably be added, for improved machining properties.

Figure 7:
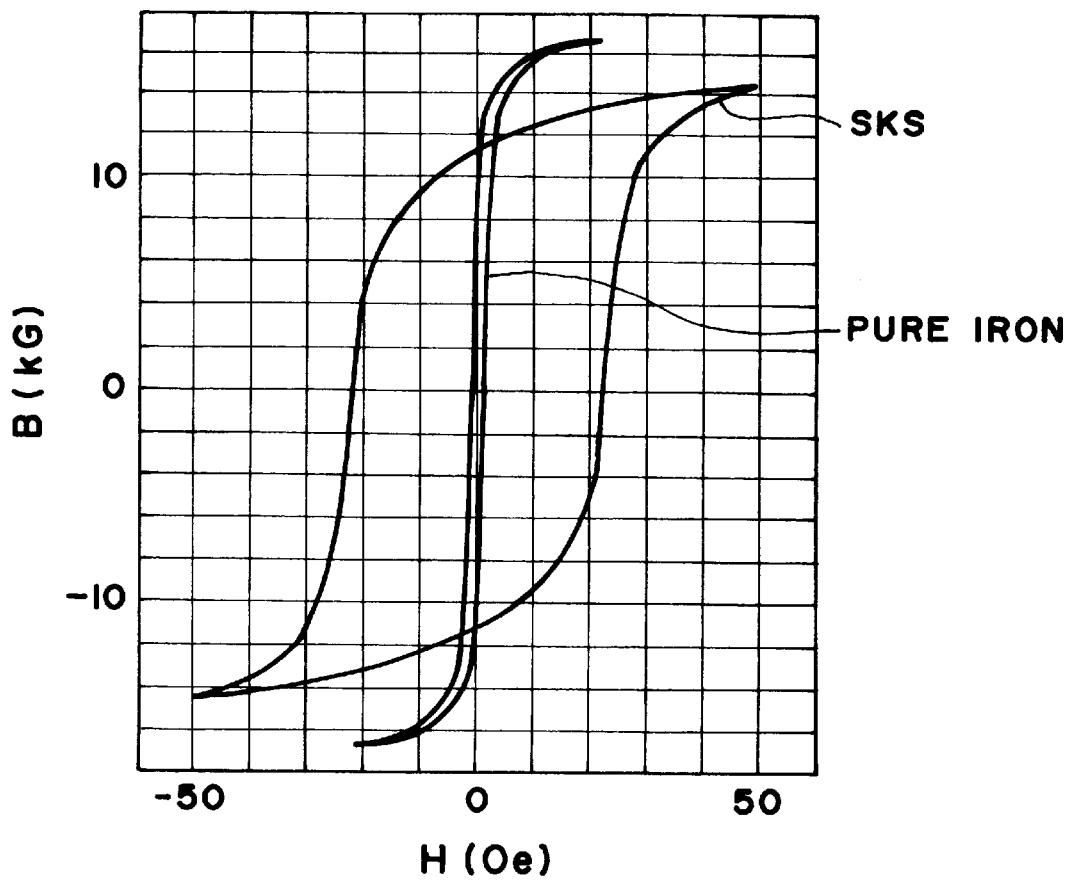
FIG. 7 is a graph for comparison of a B-H curve, with respect to materials usable in a base table of the stage mechanism of FIG. 6.

FIG. 7 is an illustration for comparison of B-H curves, for SKS and pure iron. The B-H curve area of pure iron is notably smaller than that of SKS. On the other hand, it has a saturated magnetic flux density of about 1.6 T or more. Thus, there is no problem with respect to the attraction force.

Figure 6:
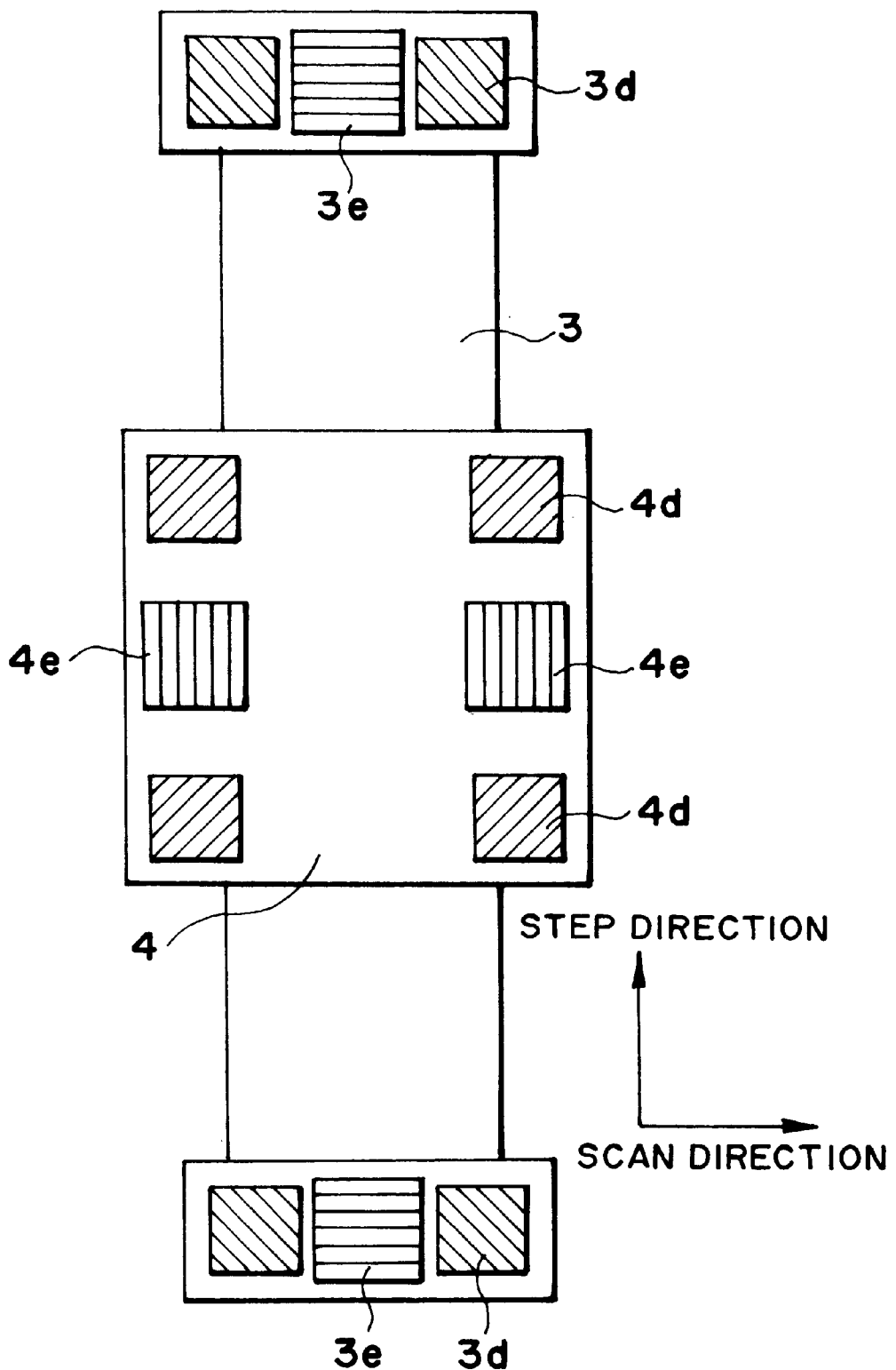
FIG. 6 is a schematic and bottom view of a wafer stage mechanism according to a third embodiment of the present invention.

FIG. 6 shows the third embodiment of the present invention, and it illustrates an X stage 4 and a Y stage 3 as viewed from the bottom, wherein the Y direction is set as a scan direction while the X direction is set as a stepping direction. In the Y stage 3, a direction perpendicular to the magnet array of rectangular magnet pieces (i.e., the lengthwise direction of the magnet piece), constituting a preloading magnet 3e, is disposed parallel to the scan direction (Y axis). In the X stage 4, a direction perpendicular to the magnet array of rectangular magnet pieces (i.e. lengthwise direction of the magnet piece), constituting a preloading magnet 4c, is disposed perpendicularly to the scan axis (Y axis) and parallel to the stepping direction (X axis).

Details of this will be described below.

Figure 8:
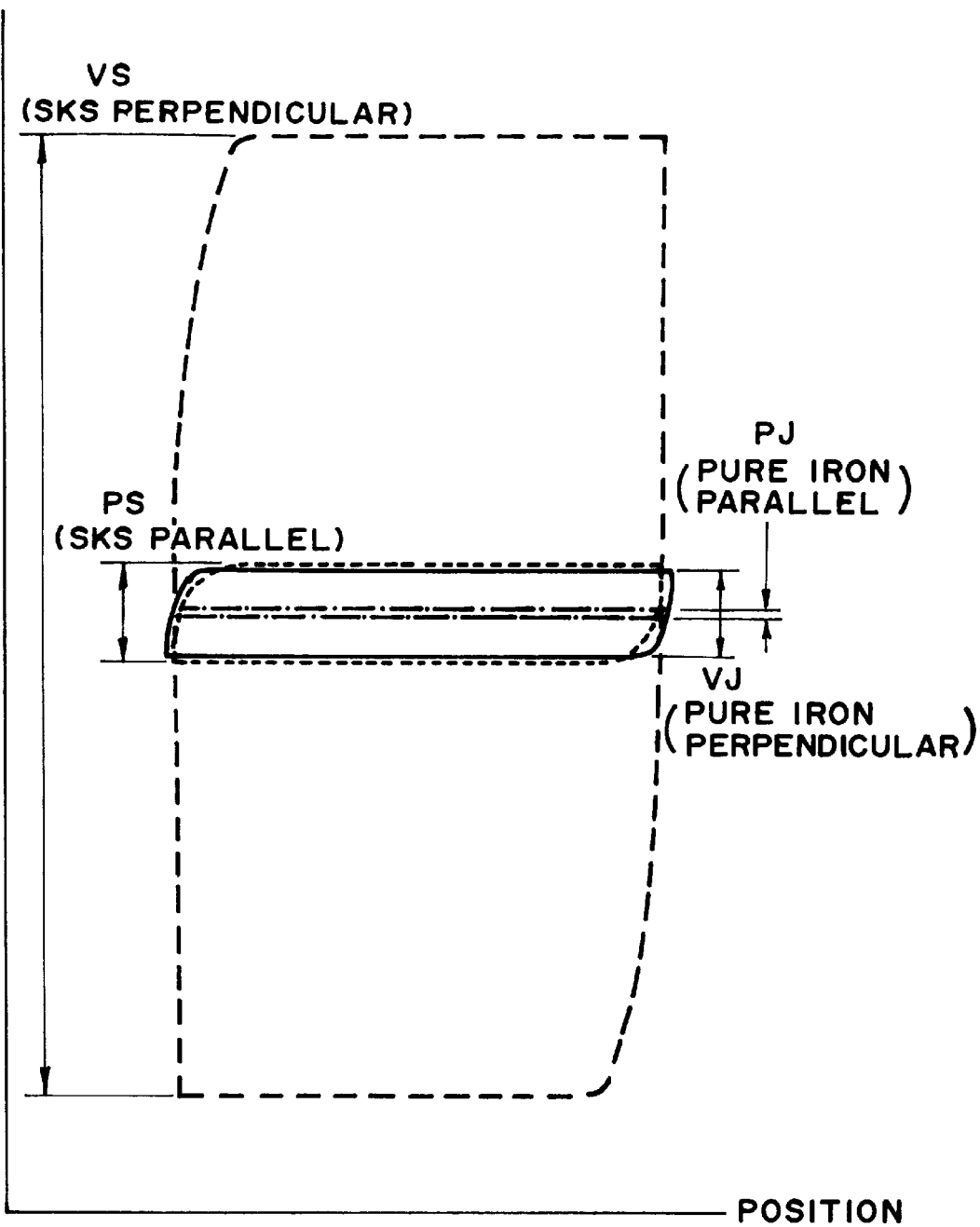
FIG. 8 is a graph for comparison of a scan resistance, with respect to the direction of the preloading magnet as well as the material of the base table, usable in the stage mechanism of FIG. 6.

FIG. 8 shows the relation between the position and resistance, for SKS and pure iron, in a case wherein two preloading magnets (corresponding to those of the X stage 4) are scanned perpendicularly to the lengthwise direction of the rectangular magnet piece and in a case wherein they are scanned parallel to it. Denoted at VS, PS, VJ and PJ are quantities corresponding to twice the scan resistance. Actually measured values of them are:

VS=1150 g (SKS perpendicular)
PS=100 g (SKS parallel)
VJ=60 g (pure iron perpendicular)
PJ=10 g (pure iron parallel).

When a low carbon iron series material is used, the scan resistance is reduced as expected.

FIG. 9 shows the relation between the position and resistance, for SKS and pure iron, in a case wherein two preloading magnets (corresponding to those of the X stage 4) are moved minutely (about 1 micron) perpendicularly to the widthwise direction of the rectangular magnet piece and in a case wherein they are moved parallel to it.

Inclination of each straight line corresponds to the spring constant in the thrust direction, as produced by the preloading magnet. Actually measured values of them are:

| | |
|---|---|
| SKS perpendicular = | 1612 g/mm |
| SKS parallel = | 126 g/mm |
| Ni series perpendicular = | 260 g/mm |
| Ni series parallel = | 25 g/mm. |

These values may be an index of easiness of transmission of a lateral component of floor vibration to the stage as held at the same position. Also, in this respect, use of a low carbon iron series material will provide reduction as expected.

As regards the pure iron parallel direction, there is no non-uniformness of scan, and the value is small. Also, the spring constant of minute displacement is small. Therefore, preferably it should be used not only in the scan but also in the minute movement. Since the Y stage 3 performs one-dimensional relative motion relative to the base table 1 in the Y direction only, such an arrangement as above is possible.

On the other hand, a current X stage 4 performs two-dimensional relative motion relative to the base table 1, and it receives thrust resistance from the magnet 4e both in the X and Y directions. For this reason, the parallel direction of the magnet longer side can be set only in one of the X and Y directions. How to set this most preferable direction is a problem.

In consideration of the above, in this embodiment, in a stage mechanism wherein the Y direction is set as the scan direction, the lengthwise direction of the elongated magnet piece is placed perpendicularly to the scan axis. This leads to a minimized spring constant of 25 g/mm in a direction perpendicular to the scan direction (i.e., at the time of stepping). While the spring constant in the scan direction is as large as 260 g/mm, this is the value as the mechanism is held stationary. It is approximately equal to zero, during the scan, because: even if it takes a positive or negative value with reference to a target value due to a servo error during the scan, the motion by scan is dominant such that the relative displacement between the magnet and the base table increases monotonously with time. As a result of this, the resistance applied from the magnet is substantially constant. This enables minimization of lateral vibration transmission from the floor. On the other hand, the scan resistance is 60 g as shown in FIG. 4. While it is larger than 10 g as the lengthwise direction is made parallel to the scan direction, it is sufficiently small as compared with the case of SKS.

In a case wherein the Y direction corresponds to the scan direction, for the Y stage 3, the lengthwise direction of the rectangular magnet piece may preferably be placed parallel to the scan direction, as in the present invention. This is because: in the scan operation in the Y direction scan, the Y linear motor is used to scan the X stage 4 and the Y state 3 as a unit. Thus, with the structure described above, the scan resistance can be reduced. In other words, without the above-described structure, unnecessary scan resistance is applied from the Y stage 3, and it produces non-uniformness of thrust in combination with the driving system.

As regards transmission of floor vibration, the spring constant in the scan direction during the scan operation is approximately zero, also in the Y stage 3. The spring constant in the direction perpendicular to the scan direction is as large as 260 g/mm at the Y stage 3, such that floor vibration is transmitted to the Y stage 3 to some extent. However, with respect to the X stage 4, that is, the stage having a wafer mounted thereon, vibration in the direction perpendicular to the scan direction is intercepted by the yaw guide 2. Therefore, transmission of floor vibration to the Y stage 3 to some extent does not raise a problem.

[Fourth Embodiment]

FIG. 10 shows a fourth embodiment of the present invention, and it illustrates an X stage 4 and a Y stage 3 as viewed from the bottom, wherein the X direction is set as the scan direction while the Y direction is set as the stepping direction. In the X stage 4, the direction along the magnet array (widthwise direction) of rectangular magnet pieces, constituting a preloading magnet 4e, is placed along the scan direction. In the Y stage 3, the direction of magnet array (widthwise direction) of rectangular magnet pieces, constituting a preloading magnet 3e, is placed along the scan direction.

This arrangement is also basically to minimize transmission of floor vibration to the X stage 4. Similar to the third embodiment, the spring constant in the direction (stepping direction) perpendicular to the scan direction is 25 g/mm, and the spring constant in the scan direction (during the scan) is substantially equal to zero.

In this example, the scanning operation is provided by the X stage 4 only, and the Y stage is held stationary. Thus, from the viewpoint of scan resistance, it may appear that the orientation of the magnet 3e of the Y stage 3 may be set either in the X or Y direction.

However, when transmission of vibration from the floor 30 is taken into account, the lengthwise direction of the rectangular magnet piece of the Y stage 3 may desirably be perpendicular to the scan direction, as in the present embodiment. With this arrangement, floor vibration in the direction perpendicular to the scan direction is not easily transmitted to the Y stage 3, while the floor vibration in the scan direction is transmitted thereto. That of the vibration transmitted to the Y stage 3 which may be transmitted to the X stage 4 is only the vibration in the direction perpendicular to the scan direction, since vibration in the scan direction is intercepted by the yaw guide 2. As a result, in total, the structure provides a system wherein transmission of floor vibration to the X stage 4 through the Y stage 3 is most effectively intercepted.

[Fifth Embodiment]

Figure 11:
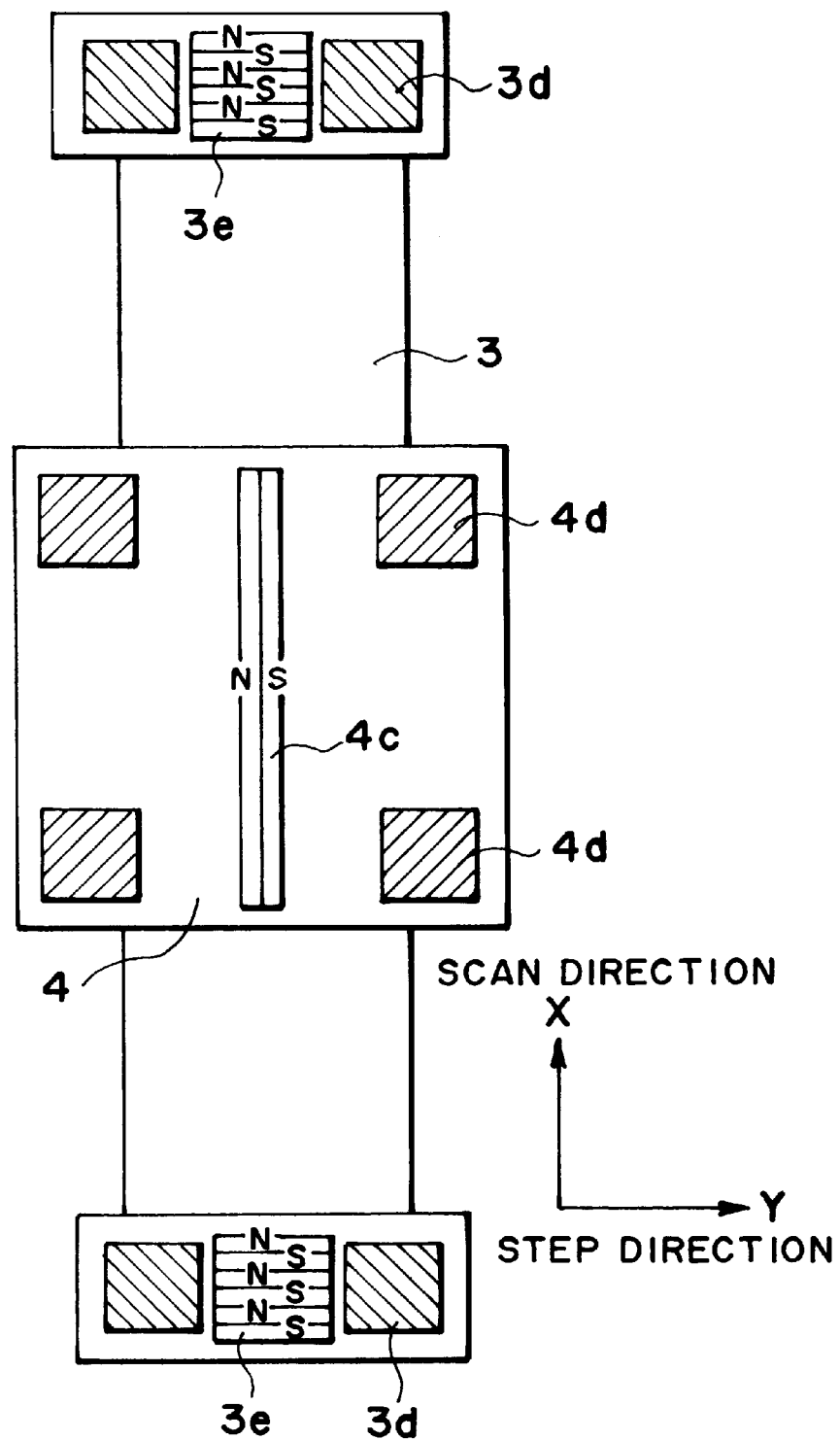
FIG. 11 is a schematic and bottom view of a wafer stage mechanism according to a fifth embodiment of the present invention.

FIG. 11 shows a fifth embodiment of the present invention, and it illustrates an X stage 4 and a Y stage 3, as viewed from above, wherein the X direction is set as the scan direction while the Y direction is set as the stepping direction. In this embodiment, the stage mechanism comprises components the same as those shown in FIGS. 13 or 14.

Preloading magnet 4e of the X stage 4 generally has an oblong shape wherein the length of a side perpendicular to the scan direction (X direction) is shorter than the length of a side parallel to the scan direction. As regards the number of poles of the magnet, it has dual poles, and the direction of array of rectangular magnet pieces (widthwise direction of the magnet piece) and the scan direction are orthogonal to each other.

As described hereinbefore, the absolute value of resistance is proportional to the product of three factors, i.e., the scan speed, the length of a side of a magnet unit perpendicular to the scan direction, and the number of poles of the magnet as counted along the scan direction.

Therefore, in order to decrease the absolute value of resistance, these three factors may be reduced. However, from the standpoint of throughput, the scan speed should not be lowered. Thus, the length of a side of the magnet unit perpendicular to the scan direction as well as the number of magnet poles counted along the scan direction are reduced. As shown in FIG. 11, the magnet unit 4e is formed with a fallen oblong shape having its shorter side placed perpendicularly to the scan direction. This effectively and notably reduces the length of the side of the magnet unit perpendicular to the scan direction, as compared with the conventional structure. Also, the direction of array of dual-pole magnets is placed perpendicularly to the scan direction, and this effectively decreases the number of magnet poles counted along the scan direction. With the combination of these effects, in the FIG. 11 embodiment, the resistance to the X stage 4 during the scan movement can be notably reduced, as compared with the conventional structure. From the standpoint of reduction of resistance, the number of magnet poles is not limited to dual poles. A six-pole or ten-pole structure may be used, provided that the direction of array of magnets is placed perpendicularly to the scan direction. However, when a unit of generally fallen oblong shape is to be provided, as in the present invention, use of a smaller number of poles may be advantageous, with respect to machining and assembling of magnets, for example.

On the other hand, the magnet unit 3e of the Y stage 3 has a conventional structure. Since, in the present embodiment, only the X stage is scanned during the scan operation and the Y stage is held stationary, there is no necessity of taking specific measures in relation to the magnet unit of the Y stage.

However, in relation to a case of X scan with a Y step such as shown in FIG. 11, the magnet unit of the Y stage 3 may have an arrangement that the direction of array of rectangular magnets is placed perpendicularly to the scan direction, with an advantage of reduced heat generation of Y stage 3 with the stepping motion. This effect will be enhanced if the magnet unit as a whole is formed with a fallen oblong shape, having a shorter side perpendicular to the stepping direction.

[Sixth Embodiment]

Figure 12:
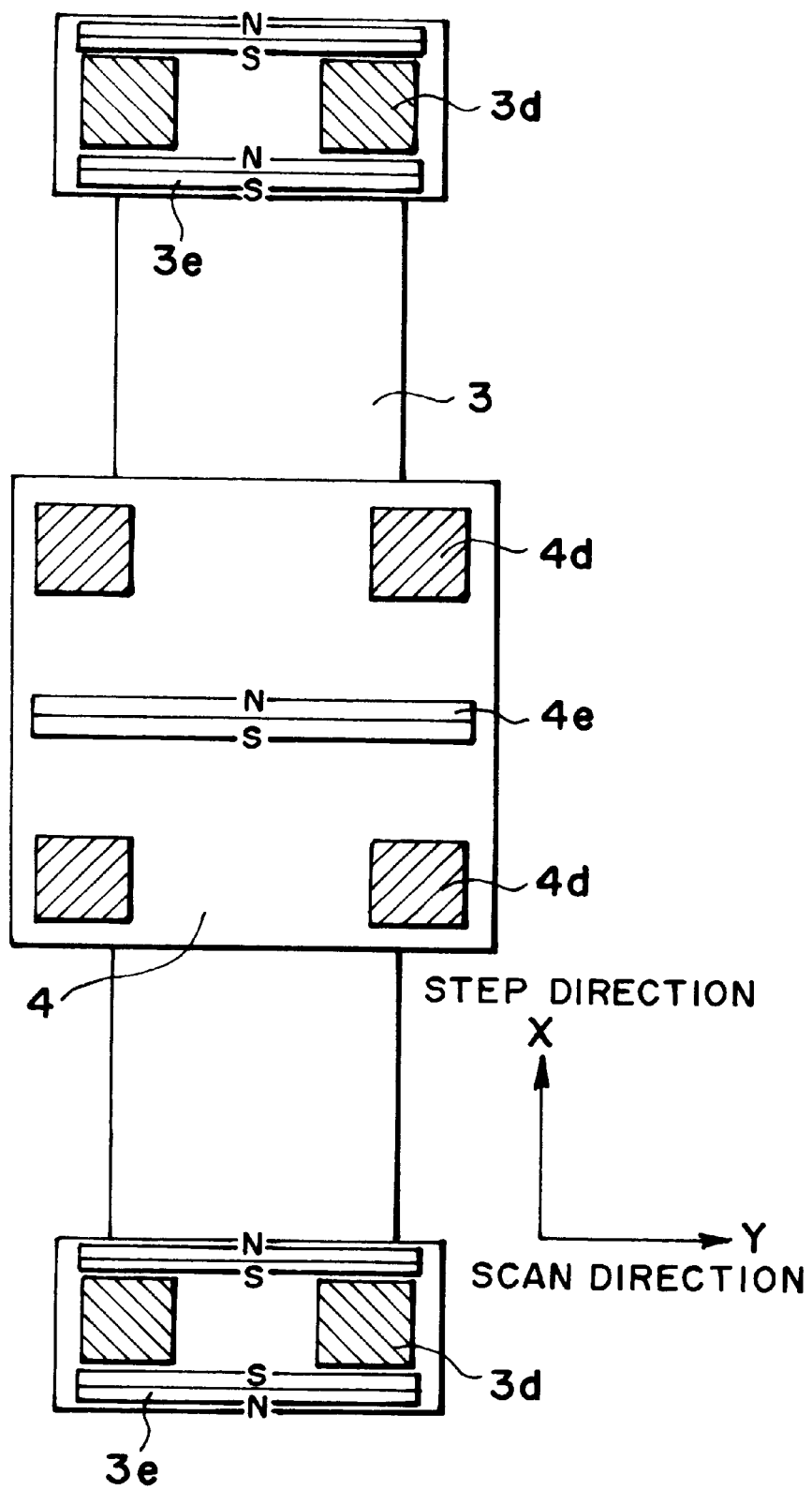
FIG. 12 is a schematic and bottom view of a wafer stage mechanism according to a sixth embodiment of the present invention.

FIG. 12 shows a sixth embodiment of the present invention, and it illustrates an X stage 4 and a Y stage 3, as viewed from the bottom, wherein the Y direction is set as the scan direction while the X direction is set as the stepping direction.

In this embodiment, for a scanning operation, the X stage 4 and the Y stage 3 move as a unit to perform the scan. Thus, both the magnet unit 4e of the X stage 4 and the magnet unit 3e of the Y stage 3 are formed with an oblong shape wherein the length of a side perpendicular to the scan direction is made shorter than that of a side parallel to the scan direction. As regards the number of poles of the magnet, it has dual poles, but the direction of array of rectangular magnets is placed perpendicularly to the scan direction. The reason for the use of such a structure of a magnet unit, as well as advantageous results of the structure, are the same as those having been described with reference to the fifth embodiment.

While the invention has been described with reference to the structures disclosed herein, it is not confined to the details set forth and this application is intended to cover such modifications or changes as may come within the purposes of the improvements or the scope of the following claims.

What is claimed is:

1. A stage mechanism comprising:

a first stage being movable in a first direction and along a base table;

a second stage being movable in a second direction, intersecting the first direction, and alone the base table, while being guided by a guide provided on said first stage;

first and second fluid static pressure applying means for supporting, with fluid, said first and second stages, respectively, upon the base table; and first and second preloading magnet units provided on said first and second stages, respectively, for attracting said first and second stages toward the base table, respectively, wherein at least one of said first and second preloading magnet units comprises a plurality of rectangular magnet pieces, wherein the first direction is perpendicular to the second direction, the first direction corresponds to a scan direction, the second direction corresponds to a stepping direction, and the rectangular magnet pieces of said second preloading magnet unit have a lengthwise direction extending along the scan direction.

2. A stage mechanism comprising:

a first stare being movable in a first direction and along a base table;

a second stage being movable in a second direction, intersecting the first direction, and along the base table, while being guided by a guide provided on said first stage;

first and second fluid static pressure applying means for supporting, with fluid, said first and second stages, respectively, upon the base table; and first and second preloading magnet units provided on said first and second stages, respectively, for attracting said first and second stages toward the base table, respectively, wherein at least one of said first and second preloading magnet units comprises a plurality of rectangular magnet pieces, wherein the first direction is perpendicular to the second direction, the first direction corresponds to a stepping direction, the second direction corresponds to a scan direction, and the rectangular magnet pieces of said second preloading magnet unit have a lengthwise direction extending along the scan direction.

3. A stage mechanism comprising:

a first stage being movable in a first direction and along a base table;

a second stage being movable in a second direction, intersecting the first direction, and along the base table, while being guided by a guide provided on said first stage;

first and second fluid static pressure applying means for supporting, with fluid, said first and second stages, respectively, upon the base table; and first and second preloading magnet units provided on said first and second stages, respectively, for attracting said first and second stages toward the base table, respectively, wherein at least one of said first and second preloading magnet units comprises a plurality of rectangular magnet pieces, wherein the first direction is perpendicular to the second direction, the first direction corresponds to a scan direction, the second direction corresponds to a stepping direction, and the rectangular magnet pieces of said second preloading magnet unit having a lengthwise direction extending along the stepping direction.

4. A stage mechanism comprising:

a first stage being movable in a first direction and along a base table;

a second stage being movable in a second direction, intersecting the first direction, and along the base table, while being guided by a guide provided on said first stage;

first and second fluid static pressure applying means for supporting, with fluid, said first and second stages, respectively, upon the base table; and first and second preloading magnet units provided on said first and second stages, respectively, for attracting said first and second stages toward the base table, respectively, wherein at least one of said first and second preloading magnet units comprises a plurality of rectangular magnet pieces, wherein the first direction is perpendicular to the second direction, the second direction corresponds to a scan direction, the first direction corresponds to a stepping direction, and the rectangular magnet pieces of said second preloading magnet have a lengthwise direction extending along the stepping direction.

5. A mechanism according to any one of claims 1 through 4, wherein the base table comprises one of a Ni series casting, low-carbon iron series material, and pure iron.

6. A mechanism according to any one of claims 1 through 4, wherein said fluid static pressure applying means comprises an air pad for discharging air therefrom.

7. An exposure apparatus comprising:

a reticle stage;

a wafer stage that includes a stage mechanism comprising:

(i) a first stage being movable in a first direction and along a base table;

(ii) a second stage being movable in a second direction, intersecting the first direction, and along the base table, while being guided by a guide provided on said first stage;

(iii) first and second fluid static pressure applying means for supporting, with fluid, said first and second stages, respectively, upon the base table; and (iv) first and second preloading magnet units provided on said first and second stages, respectively, for attracting said first and second stages toward the base table, respectively, wherein at least one of said first and second preloading magnet units comprises a plurality of rectangular magnet pieces; and anti-vibration means through which the base table is mounted on a floor, and a projection optical system mounted on said anti-vibration means, together with said reticle stage.

8. An exposure apparatus comprising:

a reticle stage;

a wafer stage that includes a stage mechanism comprising:
  (i) a first stage being movable in a first direction and along a base table;
  (ii) a second stage being movable in a second direction, intersecting the first direction, and along the base table, while being guided by a guide provided on said first stage;
  (iii) first and second fluid static pressure applying means for supporting, with fluid, said first and second stages, respectively, upon the base table; and
  (iv) first and second preloading magnet units provided on said first and second stages, respectively, for attracting said first and second stages toward the base table, respectively, wherein at least one of said first and second preloading magnet units comprises a plurality of rectangular magnet pieces; and
anti-vibration means and a projection optical system mounted on said anti-vibration means, wherein said projection optical system and the base table are isolated from each other with respect to vibration, through said anti-vibration means.

9. A device manufacturing method, comprising the steps of:
providing an exposure apparatus as recited in any one of claims 7 and 8; and
scanningly moving the wafer stage and the reticle stage synchronously at a predetermined speed ratio while illuminating a portion of the reticle with radiation, to thereby transfer a pattern of a reticle onto a wafer.

10. A stage mechanism comprising:
a first stage being movable in a first direction and along a base table;
a second stage being movable in a second direction, intersecting the first direction, and along the base table, while being guided by a guide provided on said first stage, said second stage also being movable in the first direction with the movement of said first stage;
first and second fluid static pressure applying means for supporting, with fluid, said first and second stages, respectively, upon the base table; and
first and second preloading magnet units for attracting said first and second stages toward the base table, respectively,
wherein one of the first and second directions is defined as a scan direction and said second preloading magnet unit comprises a plurality of rectangular magnet pieces, and said second preloading magnet unit has a rectangular shape having a lengthwise direction extending along the scan direction, and wherein each of the rectangular magnet pieces of said second preloading magnet unit has a length the same as the length of said second preloading magnet unit in its lengthwise direction.

11. A mechanism according to claim 10, wherein the second direction corresponds to the scan direction, and said first preloading magnet unit comprises a plurality of rectangular magnet pieces having a widthwise direction extending along the scan direction.

12. A mechanism according to claim 10, wherein the first direction corresponds to the scan direction, and said first preloading magnet unit comprises a plurality of rectangular magnet pieces having a lengthwise direction extending along the scan direction.

13. A mechanism according to claim 11 or 12, wherein each of the rectangular magnet pieces of said first preloading magnet unit has a length the same as the length of said first preloading magnet unit in its lengthwise direction.

14. A mechanism according to claim 10, wherein said fluid static pressure applying means comprises an air pad for discharging air therefrom.

15. An exposure apparatus, comprising:
a reticle stage; and
a wafer stage including a stage mechanism as recited in claim 10.

16. An apparatus according to claim 15, further comprising anti-vibration means through which the base table is mounted on a floor, together with said reticle stage.

17. An apparatus according to claim 15, further comprising anti-vibration means and a projection optical system mounted on said anti-vibration means, wherein said projection optical system and the base table are isolated from each other with respect to vibration through said anti-vibration means.

18. A mechanism according to claim 11 or 12, wherein the base table comprises one of a Ni series casting, low-carbon iron series material, and pure iron.

19. A stage mechanism comprising:
a base table having a reference plane;
a stage being movable along the reference plane;
fluid static pressure applying means for supporting said stage with respect to the reference plane; and
a preloading magnet unit having a rectangular shape, being mounted on said stage for attracting said stage toward the reference plane,
wherein said preloading magnet unit has a lengthwise direction extending along a movement direction of said stage.

20. An exposure apparatus comprising:
a reticle stage; and
a wafer stage,
wherein one of said reticle stage and said wafer stage includes a stage mechanism as recited in claim 19.

21. A device manufacturing method comprising the steps of:
providing an exposure apparatus as recited in claim 20; and
scanningly moving the wafer stage and the reticle stage synchronously at a predetermined speed ratio, while illuminating a portion of a reticle placed on the reticle stage with radiation, whereby a pattern of the reticle is transferred to a wafer placed on the wafer stage.

22. A device manufacturing method, comprising the steps of:
providing an exposure apparatus that includes a reticle stage and a wafer stage, the wafer stage including a stage mechanism comprising:
  (i) a first stage being movable in a first direction and along a base table;
  (ii) a second stage being movable in a second direction, intersecting the first direction, and along the base table, while being guided by a guide provided on the first stage, the second stage also being movable in the first direction with the movement of the first stage;
  (iii) first and second fluid static pressure applying means for supporting, with fluid, the first and second stages, respectively, upon the base table; and
  (iv) first and second preloading magnet units for attracting the first and second stages toward the base table, respectively,
wherein one of the first and second directions is defined as a scan direction and the second preloading magnet unit comprises a plurality of rectangular magnet pieces, and the second preloading magnet unit has a rectangular shape having a lengthwise direction extending along the scan direction; and scanningly moving the wafer stage and the reticle stage synchronously at a predetermined speed ratio while illuminating a portion of the reticle with radiation, to thereby transfer a pattern of a reticle onto a wafer.

23. A device manufacturing method, comprising the steps of:

providing an exposure apparatus that includes a reticle stage and a wafer stage, the wafer stage including a stage mechanism comprising:
   (i) a first stage being movable in a first direction and along a base table;
   (ii) a second stage being movable in a second direction, intersecting the first direction, and along the base table, while being guided by a guide provided on the first stage, the second stage also being movable in the first direction with the movement of the first stage;
   (iii) first and second fluid static pressure applying means for supporting, with fluid, the first and second stages, respectively, upon the base table; and
   (iv) first and second preloading magnet units for attracting the first and second stages toward the base table, respectively, wherein one of the first and second directions is defined as a scan direction and the second preloading magnet unit comprises a plurality of rectangular magnet pieces, and the second preloading magnet unit has a rectangular shape having a lengthwise direction extending along the scan direction;

scanningly moving the wafer stage and the reticle stage synchronously at a predetermined speed ratio while illuminating a portion of the reticle with radiation, to thereby transfer a pattern of a reticle onto a wafer;

developing an exposed portion of the wafer; and separating chips formed on the wafer.

* * * * *

UNITED STATES PATENT AND TRADEMARK OFFICE
CERTIFICATE OF CORRECTION

PATENT NO. : 6,128,069
DATED : October 3, 2000
INVENTOR(S) : Nobushige Korenaga

It is certified that error appears in the above-identified patent and that said Letters Patent is hereby corrected as shown below:

Title page,
Item [56] "References Cited", under "FOREIGN PATENT DOCUMENTS": "2665740 of 0000 Japan" should read -- 2665740 6/1997 Japan --.

Column 1,
Line 51, "scan raise" should read -- scan can raise --.

Column 7,
Line 58, "223 gXmm" should read -- 223 g/mm --.

Signed and Sealed this

Twenty-third Day of October, 2001

Attest:

NICHOLAS P. GODICI
*Attesting Officer*  *Acting Director of the United States Patent and Trademark Office*